United States Patent [19]

Kondo

[11] Patent Number: 4,874,081
[45] Date of Patent: Oct. 17, 1989

[54] DEVICE FOR TRANSFERRING PRINTED CIRCUIT BOARD

[75] Inventor: Kenshi Kondo, Tokyo, Japan

[73] Assignee: Nihon Den-Netsu Keiki Co., Ltd., Japan

[21] Appl. No.: 265,959

[22] Filed: Nov. 2, 1988

[30] Foreign Application Priority Data

Nov. 20, 1987 [JP] Japan .................... 62-291857

[51] Int. Cl.$^4$ ............................. B65G 29/00
[52] U.S. Cl. ................... 198/803.9; 198/817
[58] Field of Search ........ 198/803.9, 817, 626

[56] References Cited

U.S. PATENT DOCUMENTS

| 771,641 | 10/1904 | Huber et al. | 198/626 |
|---|---|---|---|
| 3,809,210 | 5/1974 | Anderson | 198/817 X |
| 4,542,820 | 9/1985 | Maxner | 198/626 X |
| 4,672,914 | 6/1987 | Sari | 198/817 X |
| 4,779,717 | 10/1988 | Eberle | 198/803.9 X |

FOREIGN PATENT DOCUMENTS 0449478 11/1974 U.S.S.R. ................ 198/803.9

Primary Examiner—Robert J. Spar
Assistant Examiner—James R. Bidwell
Attorney, Agent, or Firm—Stephen F. K. Yee

[57] ABSTRACT

A printed circuit board transferring device is disclosed which includes a pair of endless roller chains defining a printed circuit board transferring path therebetween, a plurality of support members fixed to the chains for movement therewith and each adapted to support printed circuit boards thereon, a clamp plate member provided on each of the support members and moveable between close and open positions, and engaging plates provided on both sides of the transfer path and engageable with upper surfaces of the clamp plate members to maintain the clamp plate members in the close positions, so that the printed circuit boards supported on the supporting members are clamped between the supporting members and the clamp plate members during the engagement of the clamp plate members with the engaging plates.

7 Claims, 7 Drawing Sheets

F I G. 1
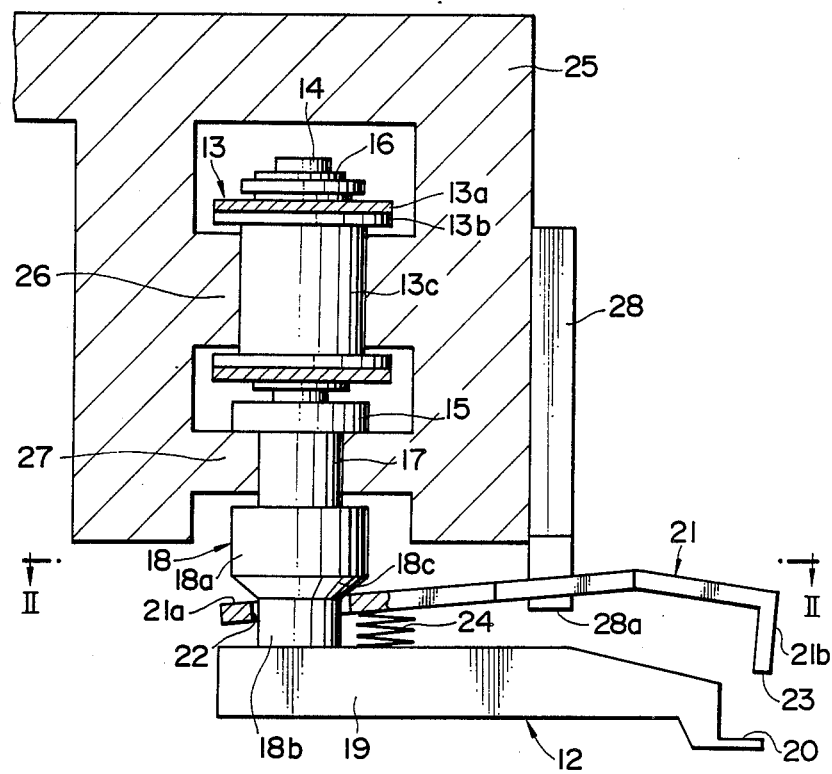

DEVICE FOR TRANSFERRING PRINTED CIRCUIT BOARD

This invention relates generally to a device for transferring printed circuit boards and, more specifically, to a device having a pair of endless conveyor chains adapted to support printed circuit boards directly thereon without employing carriers and to transfer same through a predetermined path of travel for effecting soldering.

One known printed circuit board transferring device for such a "carrierless" soldering apparatus is schematically shown in FIG. 10, in which the reference numeral 1 denotes a printed circuit board having electric parts 2 mounted thereon with their lead wires 3 depending therefrom. Designated as 7 are a pair of spaced apart endless roller chains to which a plurality of connecting rods 6 are fixedly connected for movement therewith. Connected to the rods 6 are support plates 4 each having a groove 5 into which a side edge of the printed circuit board 1 is inserted.

With this transferring device, the printed circuit boards can move vertically and horizontally within the grooves 5 unless the side edges of the board 1 fit closely with the grooves 5. However, it is very difficult to mount the printed circuit boards 1 automatically on the transferring device, when the size of the groove 5 is close to the thickness of the boards 1. Additionally, the device is required to transfer printed circuit boards with various thickness. Therefore, the known transferring device fails to operate in a stable manner especially when thin boards are to be transferred and when the boards are to be subjected to a cutting treatment of depending wires.

The present invention contemplates the provision of a printed circuit board transferring device which is free of the problems of the known device, which can transfer printed circuit boards to be soldered along a predetermined path stably and which is highly adaptable to the change of the thickness of the printed circuit boards.

In accordance with the present invention, there is provided a device for transferring printed circuit boards, comprising:

a pair of spaced apart, endless roller chains each guided by a guide rail to define a printed circuit board transferring path therebetween;

a plurality of support members fixed to said chains for movement therewith and each adapted to support thereon a side edge portion of a printed circuit board, so that the printed circuit board can be transferred along said path with opposite side edge portions thereof being supported on the support members;

a clamp plate member pivotally mounted on each of said support members and adapted to move between a close position where said clamp plate member is engageable with an upper surface of the side edge portion of the printed circuit board supported on the supporting members and an open position where said clamp plate member is incapable of engaging with the printed circuit board;

means provided on each of said support members for urging the corresponding clamp plate member to rotate so that the clamp plate member is normally maintained in the open position; and an engaging plates fixed to each of said guide rails and having a lower surface engageable with upper surfaces of the clamp plate members to maintain the clamp plate members in the close positions, whereby the printed circuit board supported on the supporting members is clamped between the supporting members and the clamp plate members during the engagement of the clamp plate members with the engaging plates.

The present invention will now be described in detail below with reference to the accompanying drawings, in which:

FIG. 1 is a fragmentary, elevational, cross-sectional view diagrammatically showing one embodiment of the printed circuit board transferring device according to the present invention;

Figure 4:
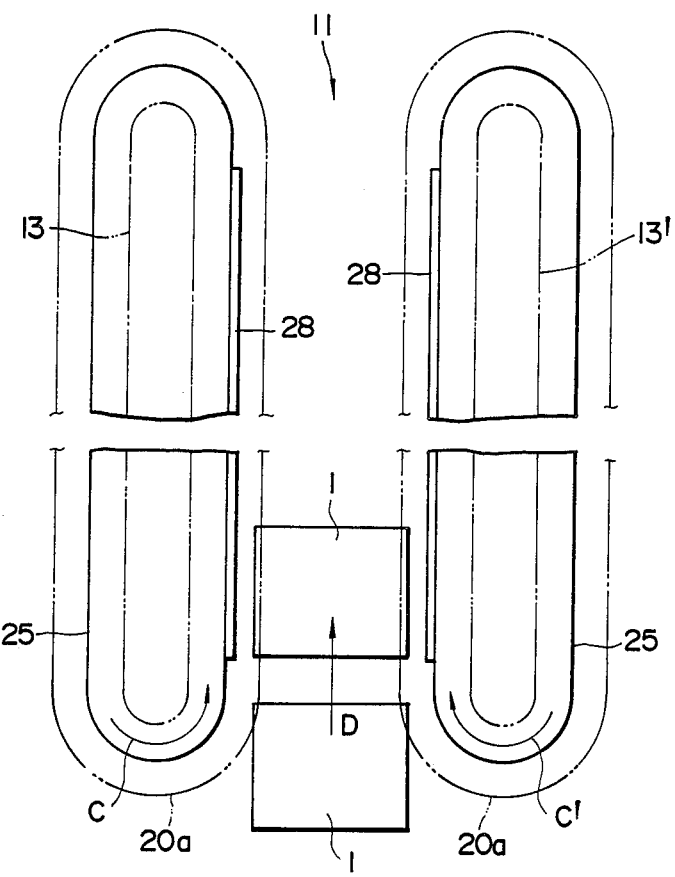
FIG. 4 is a top view of the device of FIG. 3.
Figure 5:
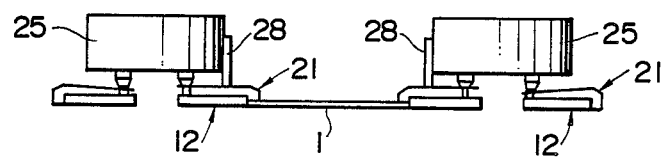
FIG. 5 is a front view of FIG. 4.

Referring now to the drawings and first to FIGS. 4 and 5, designated as 13 and 13' are a pair of spaced apart, endless roller chains each guided by a guide rail 25 to define a printed circuit board transferring path 11 between the guide rails 25. A plurality of support members 12 are fixed to both chains for movement therewith. Thus, when the chains 13 and 13' are moved upon driving of sprockets (not shown) in the directions C and C', respectively, each of the support members 12 are also moved along a path 20a. Each of the support members 12 is adapted to support thereon a side edge portion of a printed circuit board 1 which has been introduced into the transfer path 11 by any suitable means (not shown). As a result, the printed circuit board 1 can be transferred through the path 11 with opposite side portions thereof being in supporting engagement with the support members 12 in the direction shown by the arrow D.

A clamp plate member 21 is pivotally mounted on each of the support members 12 and is adapted to move between open and close positions upon pivotal movement of thereof. Each clamp plate member 21 is cooperable with the corresponding support member 12 to clamp the side edge portion of the printed circuit board 1 therebetween when the clamp plate member 21 is in the close position.

Figure 2:
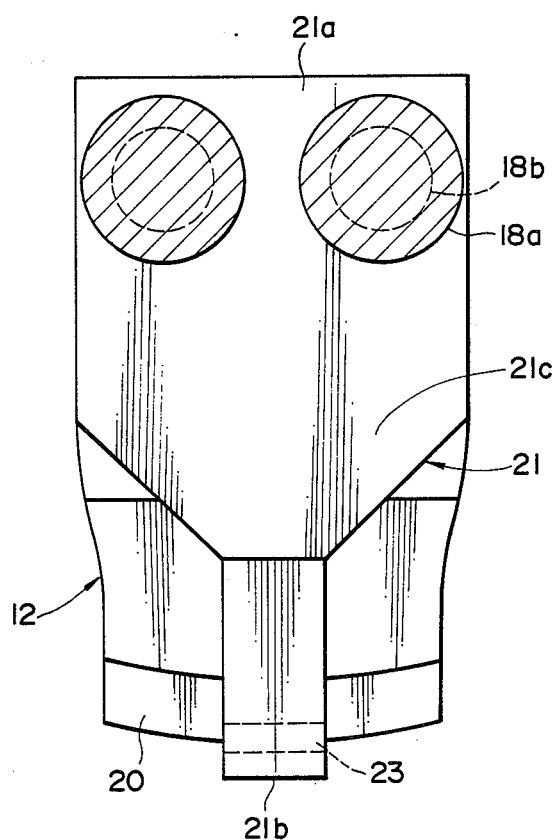
FIG. 2 is a cross section taken on the line II—II in FIG. 1.
Figure 3:
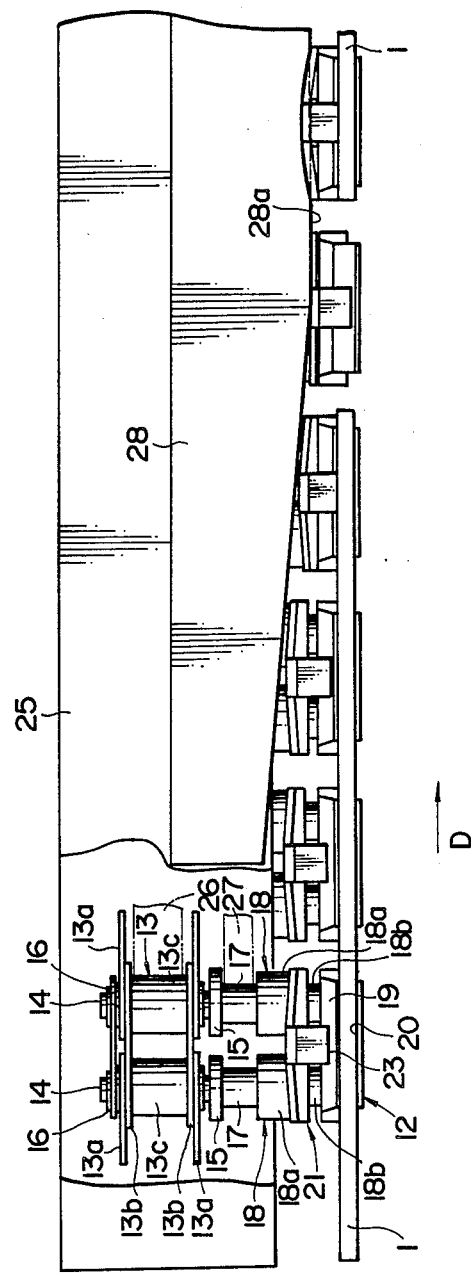
FIG. 3 is a fragmentary, side elevational view, partly cut away, of the device of FIG. 1.

A preferred structure of the support member 12 and clamp plate member 21 is specifically illustrated in FIGS. 1 through 3. As best seen from FIG. 3, each of the chains 13 and 13', which has a conventional structure, includes a multiplicity of outside link plates 13a and the same number of inside link plates 13b which are alternately rotatably connected by pins 14. Designated as 16 are clips and as 13c are rollers which are in rolling contact with a chain guide 26 of the guide rail 25.

As shown in FIG. 3, each of the support members 12 in this embodiment includes a pair of vertical connecting rods generally designated as 18 having their upper ends fixedly connected to a pair of neighboring pins 14 of the chain 13. A horizontal support plate 19 is connected to lower ends of each pair of connecting rods 18 and has an end portion 20 adapted to support an edge portion of a printed circuit board.

As shown in FIG. 1, the connecting rod 18 has a first, large diameter portion 18a, a second, small diameter portion 18b located below the first portion 18a, and a tapered, intermediate portion 18c connecting the first and second portions 18a and 18b to each other. The rod 18 is further provided with a flange portion 15 engageable by a positioning guide 27 formed in the guide rail 25 to set the level of the path of travel of the support member 12. The guide 27 has a side wall engageable with a collar 17 of each rod 18 to maintain the support member 12 in position.

Each of the clamp plate members 21 in this embodiment has a base portion 21a provided with a pair of through-holes 22 each having a diameter greater than the diameter of the second, smaller diameter portion 18b of the connecting rod 18 but not greater than the diameter of the first, larger diameter portion 18a of the connecting rod 18. The second portions 18b of each pair of the connecting rods 18 are loosely fitted into the pair of through-holes 22 of the corresponding clamp plate member 21, so that each of said clamp plate members 21 is pivotally supported on the corresponding support member 12 and is also vertically slidable along the second portion 18b.

Figure 6:
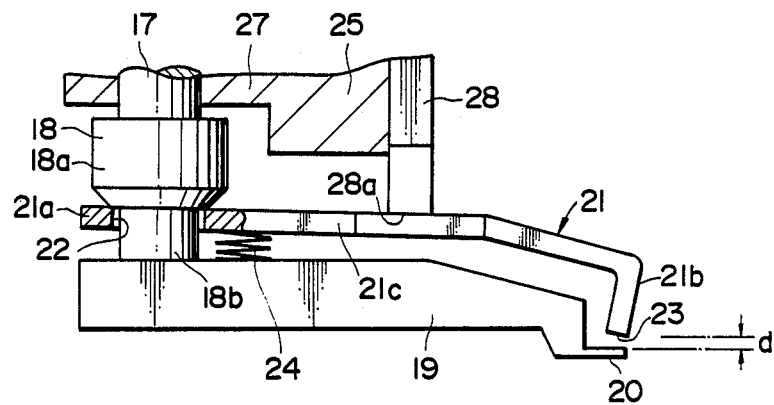
FIGS. 6 through 9 are cross-sectional views, similar to FIG. 1, showing the operation of the device of the present invention.

Each clamp plate member 21 has an intermediate portion 21c extending from the base portion 21a and a bent, narrowed portion 21b which is connected to said intermediate portion 21c and which terminates at a free end portion 23. As a result of the foregoing construction, the free end portion 23 is moveable between an uppermost position as shown in FIG. 1 and a lowermost position as shown in FIG. 6, upon the pivotal movement of the clamp plate member 21. Thus, the free end portion 23 is engageable with an upper surface of the side edge of the printed circuit board supported on the end portion 20 of the corresponding horizontal support plate 19 when it is urged toward the lowermost position.

A biasing means is provided on each of the support members 12 for urging the corresponding clamp plate member 21 to rotate so that the clamp plate member 21 is normally maintained in the open position. The biasing means in this embodiment is a spring 24 disposed to act on a lower surface of the intermediate portion 21c.

As shown in FIGS. 1, 3 and 4, a pair of engaging plates 28 are fixed to respective guide rails 25. Each engaging plate 28 has a lower surface 28a engageable with upper surfaces of the clamp plate members 21 to maintain the clamp plate members 21 in the close positions as shown in FIG. 5, i.e. to urge the free end portion 23 of the clamp plate member 21 to the lowermost position, so that the printed circuit board 1 supported on the supporting members 12 is resiliently clamped between the end portions 20 of the supporting members 12 and the free end portions 23 of the clamp plate members 21 during the engagement of the clamp plate members 21 with the lower surfaces 28a of the engaging plates 28.

The above-described printed circuit board transferring device operates as follows.

First, the level of the lower surface 28a of each of the engaging plates 28 is set so that the gap "d" between the free end portion 23 which is in the lowermost position and the end portion 20 is slightly smaller than the thickness of the printed circuit boards 1 to be transferred. The boards are intermittently fed to the upstream end portion of the transfer path 11. Since the clamp plate members 21 are not in engagement with the engaging plate 28 in the upstream end portion of the transfer path 11, the clamp plate members 21 are maintained in open positions as shown in FIG. 1, thereby to permit the feeding of the printed circuit board 1 on the end portions 20 of the support members 12. The printed circuit board 1 is then transferred in the direction D (FIG. 3) with its opposite side edges being supported on the support members 12.

Figure 7:
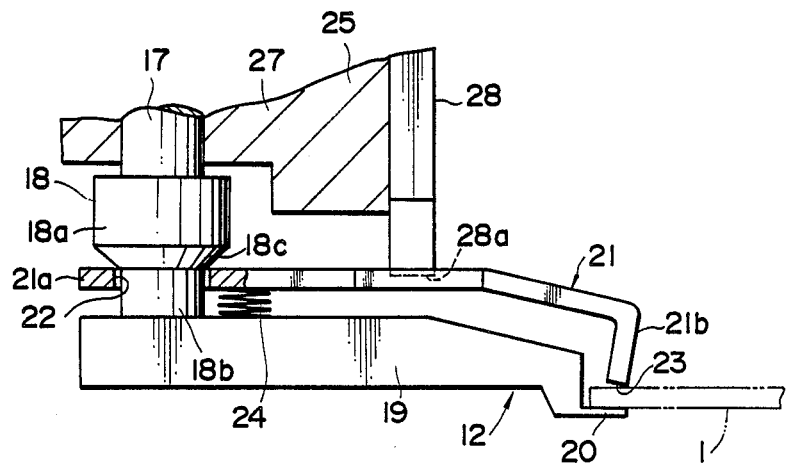

As the printed circuit board further advances in the direction D along the transfer path 11, the upper surfaces of the clamp plate members 21 are brought into engagement with a tapered portion 286 of the lower surfaces of the engaging plates 28. This causes the free end portions 23 of the clamp plate members 21 to be lowered against the biasing force of the spring 24. Then, the free end portions 23 are brought into contact with the upper surface of the printed circuit board 1 (FIG. 7). Henceforth, the clamp plate member 21 is rotated with the point of the contact between the free end portion 23 and the printed circuit board 1 as the center of rotation (or fulcrum) and with the point of the contact between the lower surface 28a of the engaging plate 28 and the upper surface of the clamp plate member 21 as the point of application, so that the through holes 22 of the clamp plate member 21 are lowered against the biasing force of the spring 24. As a result, the side edge portions of the printed circuit board 1 are resiliently clamped between the free end portion 23 and the end portion 20 of the supporting member 12 (FIG. 8).

Figure 8:
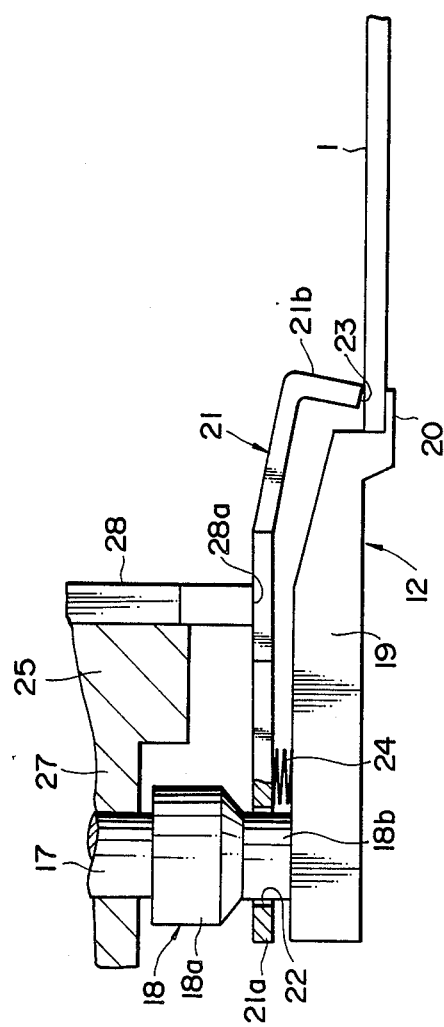
Figure 9:
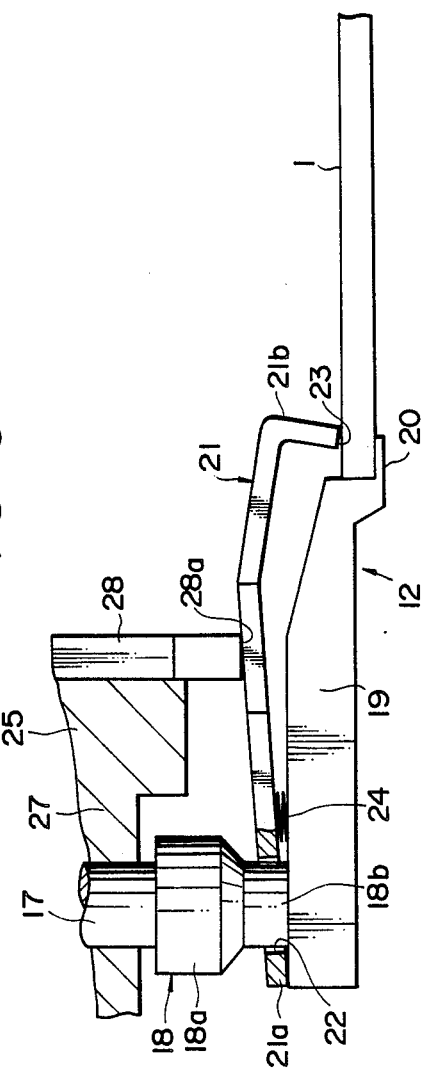
Figure 10:
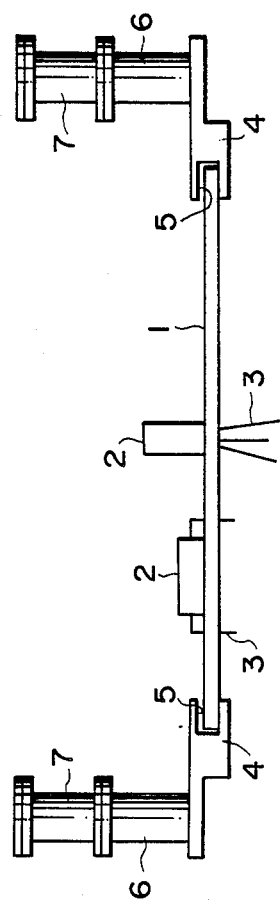
FIG. 10 is a diagrammatical illustration showing a conventional printed circuit board transferring device for a carrierless sldering apparatus.

In a case where a printed circuit board thicker than that shown in FIG.. 8 is to be transferred, the fulcrum becomes higher than that in the case of FIG. 7 or 8. Since the level of the point of application remains unchanged, the spring 24 is further depressed and the through holes 22 are lowered to a level (as shown in FIG. 9) lower than that in FIG. 8.

Since, in the above embodiment, the printed circuit board 1 is resiliently pressed by the clamp plate members 21, it can be surely and firmly clamped. This also permits the clamping of printed circuit boards with various thickness. Since the clamp plate members 21 are normally opened to provide a large space for feeding printed circuit boards thereto, warped boards can be easily transferred by the device of this invention. The resilient clamp can be also effected by, for example, using a resilient material for the clamp plate 21.

What is claimed is:

1. A device for transferring printed circuit boards, comprising:
   a pair of spaced apart, endless roller chains each guided by a guide rail to define a printed circuit board transferring path therebetween;
   a plurality of support members fixed to said chains for movement therewith and each adapted to support thereon a side edge portion of a printed circuit board, so that the printed circuit board can be transferred along said path with opposite side edge portions thereof being supported on the support members;
   a clamp plate member pivotally mounted on each of said support members and adapted to move between a close position where said clamp plate member is engageable with an upper surface of the side edge portion of the printed circuit board supported on the support members and an open position where said clamp plate member is incapable of engaging with the printed circuit board;

means provided on each of said support members for urging the corresponding clamp plate member to rotate so that the clamp plate member is normally maintained in the open position; and engaging plates fixed to each of said guide rails and having a lower surface engageable with upper surfaces of the clamp plate members to maintain the clamp plate members in the close positions, whereby the printed circuit board supported on the supporting members is clamped between the supporting members and the clamp plate members during the engagement of the clamp plate members with the engaging plates.

2. A device as set forth in claim 1, wherein each of said support members includes a vertical connecting rod having its upper end fixed to said chain, and a horizontal support plate connected to the other, loswer end of said connecting rod and having an end portion adapted to support a side edge portion of the printed circuit board.

3. A device as set forth in claim 2, wherein each of said support members includes a pair of vertical connecting rods each having an upper end connected to said chain, and a horizontal support plate connected to the other, lower ends of said connecting rods and having an end portion adapted to support a side edge portion of the printed circuit board.

4. A device as set forth in claim 3, wherein each pair of connecting rods are fixedly connected to a pair of neighboring pins, respectively, each of said pins rotatably supporting thereabout outside and inside link plates of said chain.

5. A device as set forth in claim 3, wherein each of said clamp plate members is arranged to be in pressure contact with an upper surface of a side edge portion of the printed circuit board supported on the end portion of the corresponding support member.

6. A device as set forth in claim 3, wherein each of said connecting rods has a first, large diameter portion and a second, small diameter portion located beneath said first portion, and wherein each of said clamp plate members has a base portion provided with a pair of through-holes each having a diameter greater than the diameter of said second portion of said connecting rods but not greater than the diameter of said first portion of said connecting rods, said first portions of each pair of the connecting rods being loosely fitted into the pair of through-holes of the corresponding clamp plate member, so that the base portion of each of said clamp plate members is not only pivotally supported on the corresponding support member but also vertically slidably supported thereon, each of said clamp plate members having an intermediate portion extending from said base portion and a free end portion connected to said intermediate portion, said free end portion is engageable with an upper surface of the side edge portion of the printed circuit board supported on the end portion of the corresponding support plate, said intermediate portion having a contact portion at its upper surface engageable with the engaging plate, and said urging means including a spring disposed to act on a lower surface of said intermediate portion at a position on the base portion side from said contact portion, whereby said free end portion is maintained in pressure contact with the upper surface of the printed circuit board during the engagement of the clamp plate member with the engaging plate.

7. A device as set forth in claim 6, wherein each of said connecting rods has a tapered portion connecting the first and second portions thereof to each other.

* * * * *